United States Patent [19]

Belanger, Jr. et al.

[11] Patent Number: 4,987,516

[45] Date of Patent: Jan. 22, 1991

[54] SUBSTRATE CARRIER DEVICE

[75] Inventors: Thomas D. Belanger, Jr., Clarendon Hills; Roy L. Johnson, Arlington Heights, both of Ill.

[73] Assignee: AG Communication Systems Corporation, Phoenix, Ariz.

[21] Appl. No.: 286,181

[22] Filed: Dec. 19, 1988

[51] Int. Cl.$^5$ ............................................. H05K 1/11
[52] U.S. Cl. .................... 361/413; 361/417; 211/41; 439/67
[58] Field of Search ............... 361/398, 401, 412, 413, 361/417, 419, 420; 439/65, 67, 76, 77; 211/41; 206/332, 334, 454

[56] References Cited

U.S. PATENT DOCUMENTS 3,778,681 12/1973 Wilson ................................ 361/413

FOREIGN PATENT DOCUMENTS 1232623 1/1967 Fed. Rep. of Germany ...... 361/413

Primary Examiner—Leo P. Picard
Assistant Examiner—Paramita Ghosh
Attorney, Agent, or Firm—Anthony Miologos

[57] ABSTRACT

A substrate carrier device is disclosed which is used to mount and electrically connect a plurality of electrical substrates to a carrier substrate. The substrate carrier device includes a substrate tray having planar top and bottom surfaces. The top surface is adapted to have a plurality of electrical substrates mounted thereon. Substrate guide rails extend from the major perimeter edges of the bottom surface of the substrate tray and are adapted to be inserted and accepted within a pair of substrate guides, found on the carrier substrate. Electrical connection devices, mountable to the tray between each electrical substrate, engage associated electrical connectors on the carrier substrate. A flexible circuit interconnects each electrical connection device to an adjacent and associated electrical substrate, thereby providing an electrical path between an electrical substrate and the carrier substrate.

6 Claims, 1 Drawing Sheet

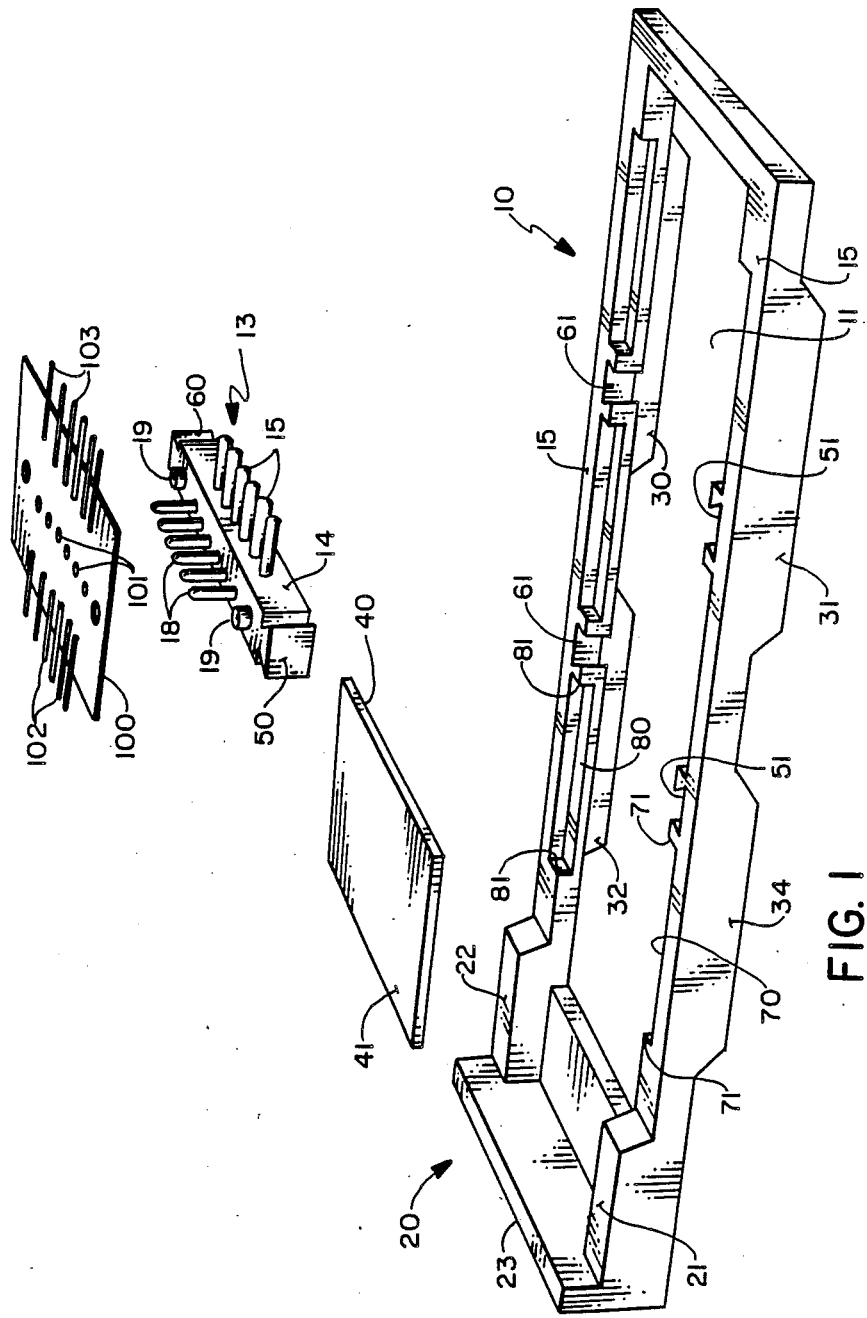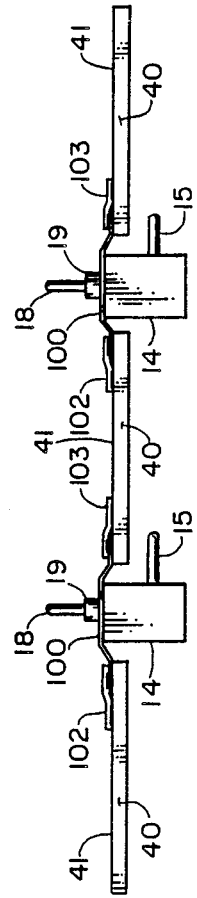

SUBSTRATE CARRIER DEVICE

CROSS REFERENCE TO RELATED APPLICATIONS

Cross reference is made to the related U.S. Patent No. 4,903,168, entitled "SUBSTRATE CARRIER DEVICE," having a common assignee as the present invention.

BACKGROUND OF THE INVENTION

This invention relates in general to modular electronic circuit devices and more particularly to a carrier device for mounting and electrically connecting electrical substrates.

In the past few years, the use of plug-in units for electrical components has found favor within the electronics industry. Such plug-in units generally comprise a structure upon which are mounted electrical assemblies or sub-assemblies, the structure being arranged to be plugged in a suitable socket provided on a base chassis. When so plugged, the components carried by the plug-in unit are electrically connected in proper circuit relation to other electrical equipment electrically coupled to the base chassis.

Recently, however, with the coming of film circuits, the need for a specialized carrier structure for housing the sub-assembly has disappeared. This is mainly due to the smaller size of a film circuit. Compared to circuits fashioned in discrete components, the film circuit is appreciably smaller and lighter. It is not uncommon to have film circuits plugged directly into larger circuit cards or other carrier substrates and, in turn, to have the larger substrate plugged into the base chassis. At present, most installations of film circuits to circuit cards is done as a permanent installation. Therefore, removal and replacement of the film circuits, though not impossible, is a tedious and labor-intensive job.

One device which alleviates the aforementioned problems is taught by Applicant's U.S. Pat. No. 4,755,906, titled, "SUBSTRATE CONNECTOR GUIDE", having a common assignee as the present invention. This device includes guide rails mounted on the perimeter edge of an electrical substrate and at least a first electrical connector mounted transversely between the guide rails. First and second substrate guides are mounted to the carrier substrate in a spaced and parallel relationship to each other. Each substrate guide includes a channel extending longitudinally along the substrate guide inner side. A plurality of drop guides are also located along the substrate guide inner side which in turn form a plurality of slots. At least a second electrical connector is mounted and electrically connected to the carrier substrate between the first and second substrate guides. The electrical substrate is installed by manually inserting the electrical substrate into the substrate guide and manually pushing the electrical substrate along the channels. Each of the substrate guide rails falls into a respective substrate guide slot. The substrate's guide rails then rest on the carrier substrate and align the first electrical connector with the second electrical connector. An electrical connection is completed between the electrical substrate and the carrier substrate when the electrical substrate is pushed fully forward within the first and second substrate guides.

The aforementioned application is limited in that the substrate must be modified by attaching the guide rails directly to the substrate. This requires an extra labor-intensive manufacturing step in the assembly of the substrate. Additionally, only substrates of a specific length can be effectively accommodated and interconnected within the substrate guide.

It would be more advantageous to provide a carrier device or tray sized to fit and function within the substrate guide but which can accommodate unmodified substrates of different lengths.

It therefore is an object of the present invention to provide a new carrier device for mounting and electrically connecting electronic substrates.

SUMMARY OF THE INVENTION

In accomplishing the object of the present invention there is provided a substrate carrier device for mounting and electrically connecting an electrical substrate to a pair of substrate guides mounted on a carrier substrate.

The substrate carrier device of the present invention comprises a substrate tray used for supporting an electrical substrate, including a top surface, a bottom surface and guide rails extending from the bottom surface. The guide rails are used to mount the substrate carrier device to the substrate guides. The guide rails are arranged to be slidably inserted and accepted within the substrate guide's.

An electrical connecting device is included which is mounted transversely between the major perimeter edges of the top surface of the substrate tray. The top surface of the substrate tray further includes a pair of substrate mounting recesses. Each substrate mounting recess, is positioned directly opposite each other on respective major perimeter edges of substrate tray and in proximity to the electrical connecting device. The substrate mounting recesses are adapted, in combination, to accept a respective edge of the electrical substrate therebetween, mounting the electrical substrate to the substrate tray.

Finally, the substrate carrier device of the present invention includes a flexible electrical circuit device used to electrically connect an electrical connecting device to an adjacent and associated electrical substrate.

BRIEF DESCRIPTION OF THE DRAWINGS

A better understanding of the invention may be had from the consideration of the following detailed description taken in conjunction with the accompanying drawings in which:

FIG. 1 is an exploded perspective view of the carrier device of the present invention;

FIG. 2 is a side elevational view showing the interconnection of the substrates, electrical connectors and flexible circuit devices of the carrier device of the present invention.

DESCRIPTION OF THE PREFERRED EMBODIMENT

Turning now to FIGS. 1 and 2 of the included drawings, the device in accordance with the present invention includes a planar substrate tray 10 having a large central opening 11 extending through substrate tray 10. Opening 11 serves to lighten the tray structure 10 and to allow ambient air to reach the bottom of an installed substrate, thereby effectively cooling the substrate. One end of the top surface 15 of substrate tray 10 includes a handle structure 20. Handle structure 20 comprises arms 21 and 22 located on opposite major perimeter edges of the top surface 15. An end member 23 extends along the minor perimeter edge between members 21 and 22. The handle structure facilitates the insertion and removal of the carrier device of the present invention.

The bottom surface 17 of of substrate tray 10 is substantially identical to top surface 15, with the exception of guide rails 30, 31 and 32, 34. A first pair of forward guide rails 30, 31 extend in a downward direction from opposite major perimeter edges of the bottom surface 17 of substrate tray 10, adjacent to the end opposite the handle structure 20. A second pair of rear guide rails 32, 34 also extend in a downward direction from opposite major perimeter edges of the bottom surface 17 of substrate tray 10. The guide rails 30, 31 and 32, 34 allow the present invention to be mounted within substrate guides mounted on a carrier substrate (not shown). A better understanding of the mounting process may be had by reference to U.S. Pat. Nos. 4,755,906 and 4,755,907, having a common assignee with the present invention.

A plurality of electrical connection devices such as connector device 13 are transversely mounted to substrate tray 10. Each connector device 13 includes a body member 14 made from an insulating material and includes a first set of electrically-conductive posts 18 extending vertically over body member 14. A second set of electrically-conductive posts 15 extend from body member 14 horizontally, parallel to substrate tray 10's bottom surface 17. Each post 18 is electrically connected to a respective one of posts 15 and is capable of passing electrical signals to and from respective connected posts. Body member 14 further includes a first notched key-end 50 located proximate a first minor end of body 14. A second notched key-end 60 is located proximate a second minor end of body 14 opposite the first minor end. Key-ends 50 and 60 of each connector device 13 are disposed to be accepted within key-end recesses 51 and 61 respectively, formed on the top surface 15 of substrate tray 10. As can be appreciated, an installed electrical connector device 13 extends transversely across opening 11 from a first major side of substrate tray 10 to a second and opposite major side.

Each post 15 of device 13 is arranged to be accommodated within and make an electrical connection to an electrical socket device (not shown) located between the substrate guide rails of the aforementioned U.S. Pat. Nos. 4,755,906 and 4,755,907.

The substrate tray 10 described hereinabove, is intended to carry a plurality of electrical substrates such as the electrical substrate 40 shown in FIGS. 1 and 2. The electrical substrate 40 can be one of any number of circuit carrying devices such as a printed circuit board having discrete electronic components or a glass substrate having thin or thick film circuits printed thereon. Each electrical substrate 40 is disposed to be mounted within a pair of recesses 70, 80 located on opposite major sides of substrate tray 10. Each recess 70, 80 is of a length and height to accommodate a respective edge of electrical substrate 40. With the electrical substrate 40 mounted on recesses 70, 80 electrical substrate 40 extends over opening 11, from a first major side of substrate tray 10 to a second and opposite major side. When installed, a top surface 41 of electrical substrate 40 fits flush with top surface 15 of substrate tray 10. Recesses 70, and 80 also include a pair of resilient tab members 71, 81 respectively. Each pair of tab members 71, 81 include first and second tabs located on opposite ends of their respective recesses. Tabs 71 and 81 are arranged to snap over surface 41 of electrical substrate 40 holding electrical substrate 40 in position when the electrical substrate 40 is installed on substrate tray 10.

As can be seen in FIG. 1, the organizational structure of the present invention contemplates the positioning of an electrical connector device 13 between two electrical substrates 40. In this embodiment substrate tray 10 is capable of accommodating three electrical connector devices 13, between four electrical substrates 40. It will be appreciated by those skilled in the art, that the substrate tray 10 of the present invention may be modified to accommodate any number of connecting devices 13 between pairs of electrical substrates 40 and therefore is not limited thereto.

Each electrical substrate 40 is electrically connected to an associated connector device 13 with a flexible circuit 100. Flexible circuit 100 includes a plurality of electrically conductive traces (not shown), deposited on a film carrier such as a mylar or other plastic sheet. Each conductive trace extends from one of a plurality of plated holes 101, which extend transversely across flexible circuit 100, to an associated electrical contact of a plurality of electrical contacts 102 and 103. Each plurality of electrical contacts 102 and 103 extend from opposite minor sides of flexible circuit 100.

As can be seen in FIG. 2, a pair of electrical substrates 40 are connected to an associated electrical connector device 13 by mating each plated hole 101 with a respective one of posts 18. Each respective electrical contact of electrical contacts 102 and 103, are electrically connected to respective terminal pads found on each electrical substrate 40. Any method presently known to make the electrical connection between plated holes 100 and posts 18 and between electrical contacts 102, 103 and an associated electrical substrate may be employed, such as a solder connection.

To facilitate the installation and alignment of the flexible circuit to connector device 13, the connector device 13 further includes a pair of alignment members 19, each located outboard and on opposite sides of the plurality of posts 18. Each alignment member 19 extends from body 14 in the same direction as posts 18. Alignment members 19 are adapted to be accommodated within a respective alignment-hole (not shown) on the flexible circuit 100.

It will be appreciated by those skilled in the art that the carrier device of the present invention can be easily modified to carry and electrically connect any number of substrates as long as the aforementioned organizational structure of substrates, electrical connecting devices and flexible circuits are employed.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A substrate carrier device for mounting and electrically connecting at least one electrical substrate to a pair of substrate guides mounted on a carrier substrate, said carrier substrate including a plurality of electrical connectors connected to a source of electrical signals mounted between said pair of substrate guides, said substrate carrier device comprising:

means for supporting an electrical substrate including a generally planar top surface, a generally planar bottom surface, and an opening extending longitudinally along a central axis of said means for supporting;

means for mounting said substrate carrier device to said substrate guides located along the major perimeter edges of said bottom surface of said means for supporting, said means for mounting arranged to be slidably inserted and accepted within said substrate guides; and at least one means for making an electrical connection mounted transversely between the major perimeter edges of the top surface of said means for supporting, said means for making an electrical connection having at least a first electrical post extending from said means for making an electrical connection, and at least a second electrical post extending from said means for making an electrical connection, perpendicular to said first electrical post and parallel to said bottom surface, said second electrical post arranged to be accommodated within a respective one of said plurality of electrical connectors, connecting said means for making an electrical connection to said source of electrical signals;

at least a first pair of substrate mounting recesses, each substrate mounting recesses of said pair of substrate mounting recesses located directly opposite each other on respective major perimeter edges of said means for supporting, proximate said means for making an electrical connection, said first pair of substrate mounting recesses arranged to accept said electrical substrate therebetween; and flexible circuit means having at least one conductive path extending from an electrically conductive hole to at least a first electrical contact, said first electrical contact extending from a first minor edge of said flexible circuit means, and said electrically conductive hole arranged to be accepted and electrically connected to said first electrical post of said means for making an electrical connection, said first electrical contact arranged to be electrically connected to said electrical substrate connecting said source of electrical signals from said means for making an electrical connection to said electrical substrate.

2. The substrate carrier device as claimed in claim 1, wherein: said means for supporting further includes a handle extending along the minor perimeter edge of said top and bottom surfaces, said handle arranged to aid in the insertion and extraction of said substrate carrier device from said substrate guides.

3. The substrate carrier device as claimed in claim 2, wherein: said means for supporting is a generally planar tray structure having first and second major perimeter edges and first and second minor perimeter edges along said top and bottom surfaces.

4. The substrate carrier device as claimed in claim 1, wherein: said means for mounting said electrical substrate are first and second pairs of guide rails, said first pair of guide rails extending from opposite major perimeter edges of said bottom surface adjacent said said first minor perimeter, and said second pair of guide rails extending from opposite major perimeter edges of said bottom surface intermediate said first pair of guide rails and said second minor perimeter edge.

5. A substrate carrier device for mounting and electrically connecting at least one electrical substrate to a pair of substrate guides mounted on a carrier substrate, said carrier substrate including a plurality of electrical connectors connected to a source of electrical signals mounted between said pair of substrate guides, said substrate carrier device comprising:

means for supporting an electrical substrate including a generally planar top surface, a generally planar bottom surface, and an opening extending longitudinally along a central axis of said means for supporting;

means for mounting said substrate carrier device to said substrate guides located along the major perimeter edges of said bottom surface of said means for supporting, said means for mounting arranged to be slidably inserted and accepted within said substrate guides; and, a plurality of electrical connector devices mounted transversely between the major perimeter edges of the top surface of said means for supporting, said plurality of electrical connector devices having an insulating body and a first and a second plurality of electrical posts extending from said insulating body, with said second plurality of electrical posts electrically connected and extending perpendicularly to said first plurality of electrical posts, parallel to said bottom surface, said second plurality of electrical posts arranged to be accommodated within a respective one of said plurality of electrical connectors, connecting said means for making an electrical connection to said source of electrical signals;

a plurality of pairs of substrate mounting recesses, each substrate mounting recess of each of said plurality of pairs of substrate mounting recesses located directly opposite each other on respective major perimeter edges of said means for supporting, with each pair proximate a respective one of said plurality of electrical connector devices, each of said pairs of substrate mounting recesses arranged to accept an electrical substrate therebetween; and a plurality of flexible circuit means, each flexible circuit having a plurality of conductive paths each extending from a respective one of a plurality of electrically conductive holes to a plurality of first and second electrical contacts, said first plurality of electrical contacts extending from a first minor edge of said flexible circuit means and said second plurality of electrical contacts extending from a second minor edge of said flexible circuit means, each of said electrically conductive holes of each of said flexible circuit means arranged to be accepted and electrically connected to a respective one of said first plurality of electrical posts of a respective and associated one of said plurality of electrical connector devices, and said first plurality of electrical contacts arranged to be electrically connected to a first associated electrical substrate of said plurality of substrates and said second plurality of contacts arranged to be electrically connected to a second associated electrical substrate of said plurality of electrical substrates, connecting said source of electrical signals from said plurality of electrical connector devices to said plurality of electrical substrates.

6. A substrate carrier device for mounting and electrically connecting an electrical substrate to a pair of substrate guides mounted on a carrier substrate, said substrate carrier device comprising:

means for supporting an electrical substrate including a top surface and a bottom surface;

means for mounting said substrate carrier device to said substrate guides located along the major perimeter edges of said bottom surface of said means for supporting, said means for mounting arranged to be slidably inserted and accepted within said substrate guides; and, means for making an electrical connection mounted transversely between the major perimeter edges of said means for supporting;

a pair of substrate mounting recesses, each substrate mounting recess of said pair of substrate mounting recesses located directly opposite each other on respective major perimeter edges of said means for supporting, proximate said means for making an electrical connection, said pair of substrate mounting recesses arranged to accept said electrical substrate therebetween; and circuit means connecting said means for making an electrical connection to said electrical substrate.

* * * * *